United States Patent
Chiu et al.

(10) Patent No.: US 10,868,022 B2
(45) Date of Patent: Dec. 15, 2020

(54) FLASH MEMORY DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Sheng Fen Chiu, Shanghai (CN); Liang Chen, Shanghai (CN); Chao Feng Zhou, Shanghai (CN); Xiao Bo Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/863,754

(22) Filed: Jan. 5, 2018

(65) Prior Publication Data

US 2018/0197871 A1 Jul. 12, 2018

(30) Foreign Application Priority Data

Jan. 6, 2017 (CN) .......................... 2017 1 0011191

(51) Int. Cl.
*H01L 27/11521* (2017.01)
*H01L 29/788* (2006.01)
(Continued)

(52) U.S. Cl.
CPC .. *H01L 27/11521* (2013.01); *H01L 21/32139* (2013.01); *H01L 21/764* (2013.01);
(Continued)

(58) Field of Classification Search
CPC ................................................ H01L 21/76837
See application file for complete search history.

(56) References Cited

U.S. PATENT DOCUMENTS

| 5,496,438 | A | * | 3/1996 | Wootton | ................. G03F 7/427 |
| | | | | | 134/1.1 |
| 5,909,044 | A | * | 6/1999 | Chakravarti | ...... H01L 27/10861 |
| | | | | | 257/301 |

(Continued)

FOREIGN PATENT DOCUMENTS

| CN | 102986022 A | 3/2013 |
| CN | 103066075 A | 4/2013 |

*Primary Examiner* — John A Bodnar
(74) *Attorney, Agent, or Firm* — Anova Law Group, PLLC

(57) ABSTRACT

Flash memory devices and fabrication methods thereof are provided. An exemplary method includes providing discrete bit lines on a semiconductor substrate, a first dielectric layer on top surfaces of the bit lines, and a floating gate structure on the first dielectric layer, trenches being formed between adjacent bit lines and on the semiconductor substrate; forming a sacrificial layer with a top surface above the top surfaces of the bit lines in the trenches; forming a second dielectric layer on top and side surfaces of the floating gate structure and the top surface of the sacrificial layer; forming a control gate structure on the second dielectric layer; removing portions of the second dielectric layer, the floating gate structure and the first dielectric layer to expose a portion of the sacrificial layer; and removing the sacrificial layer from the adjacent bit lines and the semiconductor substrate, thereby forming air gaps.

19 Claims, 6 Drawing Sheets

(51) Int. Cl.
*H01L 29/423* (2006.01)
*H01L 29/06* (2006.01)
*H01L 29/49* (2006.01)
*H01L 29/66* (2006.01)
*H01L 21/3213* (2006.01)
*H01L 21/764* (2006.01)
*H01L 21/28* (2006.01)

(52) U.S. Cl.
CPC .... *H01L 29/0649* (2013.01); *H01L 29/40114* (2019.08); *H01L 29/42324* (2013.01); *H01L 29/42328* (2013.01); *H01L 29/4916* (2013.01); *H01L 29/66825* (2013.01); *H01L 29/788* (2013.01)

(56) References Cited

U.S. PATENT DOCUMENTS

2013/0248969 A1* 9/2013 Suzuki .............. H01L 29/42324
257/316
2013/0307044 A1* 11/2013 Kinoshita ......... H01L 29/66825
257/314

* cited by examiner

FLASH MEMORY DEVICE AND FABRICATION METHOD THEREOF

CROSS-REFERENCES TO RELATED APPLICATIONS

This application claims the priority of Chinese patent application No. 201710011191.5, filed on Jan. 6, 2017, the entirety of which is incorporated herein by reference.

FIELD OF THE DISCLOSURE

The present disclosure generally relates to the field of semiconductor manufacturing technologies and, more particularly, relates to flash memory devices and fabrication methods.

BACKGROUND

Non-volatile semiconductor memory includes electrically erasable programmable read-only memory (EEPROM) and electrically programmable read-only memory (EPROM). The EEPROM includes flash EEPROM, i.e., flash memory. The flash memory includes NOR flash memory and NAND flash memory. The NOR flash memory utilizes random storage medium; and is used in the applications with relative small data size. The NAND flash memory utilizes consecutive storage medium; and is used in the applications with relative large data size.

NAND device includes a commonly used structure of flash memory. Usually, the NAND device is better than hard drive. With the continuous demanding of the products with low power consumption, light weight and better performance, the NAND devices have shown broader applications because of their high unit density, high storage density, and fast writing/erasing speed. At the same time, the size of the NAND devices is almost one half of the size of the NOR device, and higher capacity and faster writing/erasing speed are provided under the provided mould size.

However, it is desirable to improve the electrical properties of the flash memory devices. The disclosed flash memory devices and methods are directed to solve one or more problems set forth above and other problems in the art.

BRIEF SUMMARY OF THE DISCLOSURE

One aspect of the present disclosure includes a method for forming a flash memory device. The method includes providing a plurality of discrete bit lines on a semiconductor substrate, a first dielectric layer on top surfaces of the bit lines, and a floating gate structure on the first dielectric layer. Trenches are formed between adjacent bit lines and on the semiconductor substrate. The method may also include forming a sacrificial layer with a top surface above the top surfaces of the bit lines in the trenches; forming a second dielectric layer on a top surface and side surfaces of the floating gate structure and the top surface of the sacrificial layer; forming a control gate structure on the second dielectric layer; removing portions of the second dielectric layer, the floating gate structure and the first dielectric layer exposed by the control gate structure to expose a portion of the top surface of the sacrificial layer; and removing the sacrificial layer from the adjacent bit lines and the semiconductor substrate, thereby forming air gaps.

Another aspect of the present disclosure includes a flash memory device. The flash memory device includes a semiconductor substrate, a plurality of bit lines on the semiconductor substrate, a first dielectric layer on top surfaces of the bit lines and a floating gate structure on the first dielectric layer; a second dielectric layer on top and side surfaces of the floating gate structure; and a control gate structure on the second dielectric layer. Air gaps are formed between adjacent bit lines and the semiconductor substrate.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

With the continuous miniaturization of devices, the distances between adjacent bit-lines (BLs) have become smaller and smaller. Thus, the interferences between the adjacent BLs have become more and more obvious. Accordingly, the electrical properties of the flash memory device are affected.

The present disclosure provides a flash memory device and a fabrication method of the flash memory device. The fabrication method may include providing a semiconductor substrate, a plurality of discrete bit lines on the semiconductor substrate, a first dielectric layer on top surfaces of the bit lines and a floating gate structure on the first dielectric layer. Trenches are formed between adjacent bit lines and one the semiconductor substrate. A sacrificial layer is filled in the trenches; and the top surface of the sacrificial layer is above the tops surfaces of the bit lines. The fabrication method may also include forming a second dielectric layer on the top surface and the side surfaces of the floating gate structure and the top surface of the sacrificial layer; forming a control gate layer on the second dielectric layer; patterning the control gate layer to form a control gate structure exposing a portion of the second dielectric layer; removing a portion of the second dielectric layer, the floating gate structure and the first dielectric layer exposed by the control gate structure to expose a portion of the top surface of the sacrificial layer; and removing the sacrificial layer to form air gaps between adjacent bit lines after exposing a portion of the top surface of the sacrificial layer.

In the disclosed fabrication method of a flash memory device, the air gaps may be formed between adjacent bit lines, the relative dielectric constant between adjacent bit lines may be reduced. Accordingly, the electrical interferences between adjacent bit lines may be reduced or substantially avoided; and the electrical properties of the flash memory device may be improved.

Figure 8:
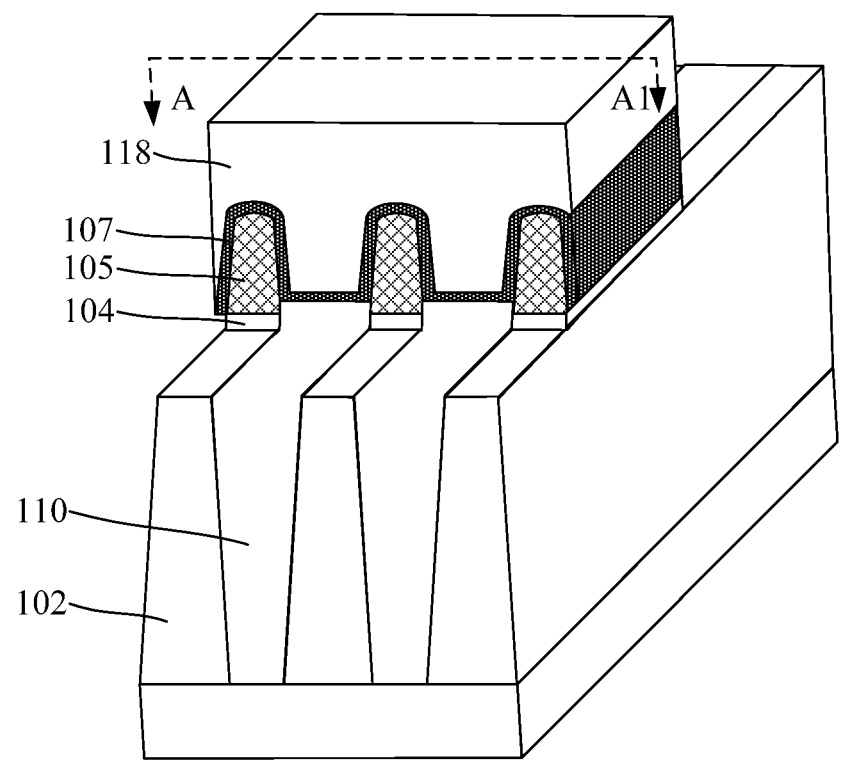
Figure 9:
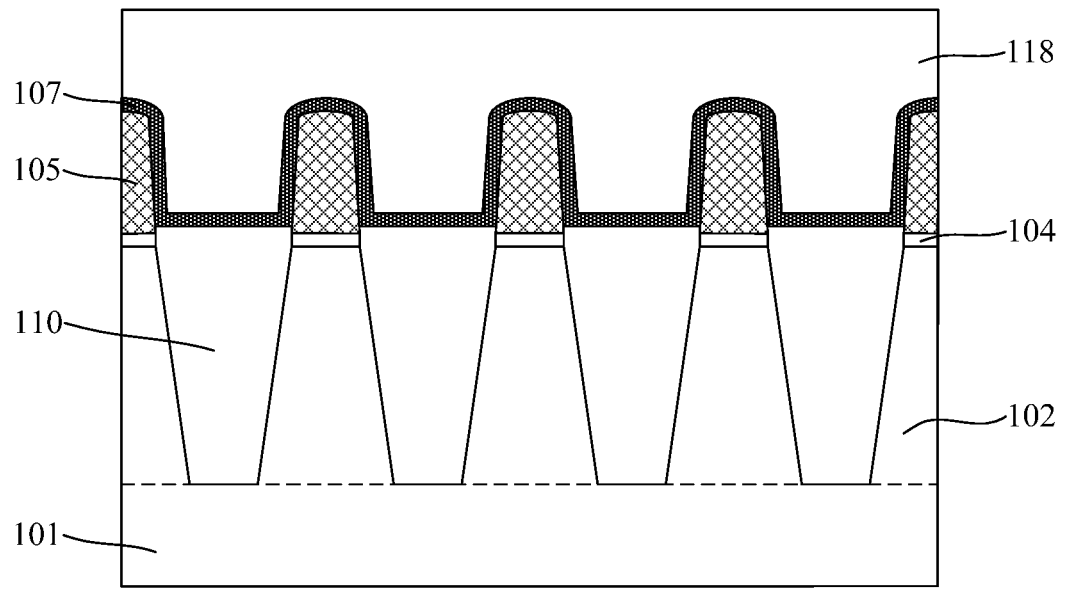
Figure 10:
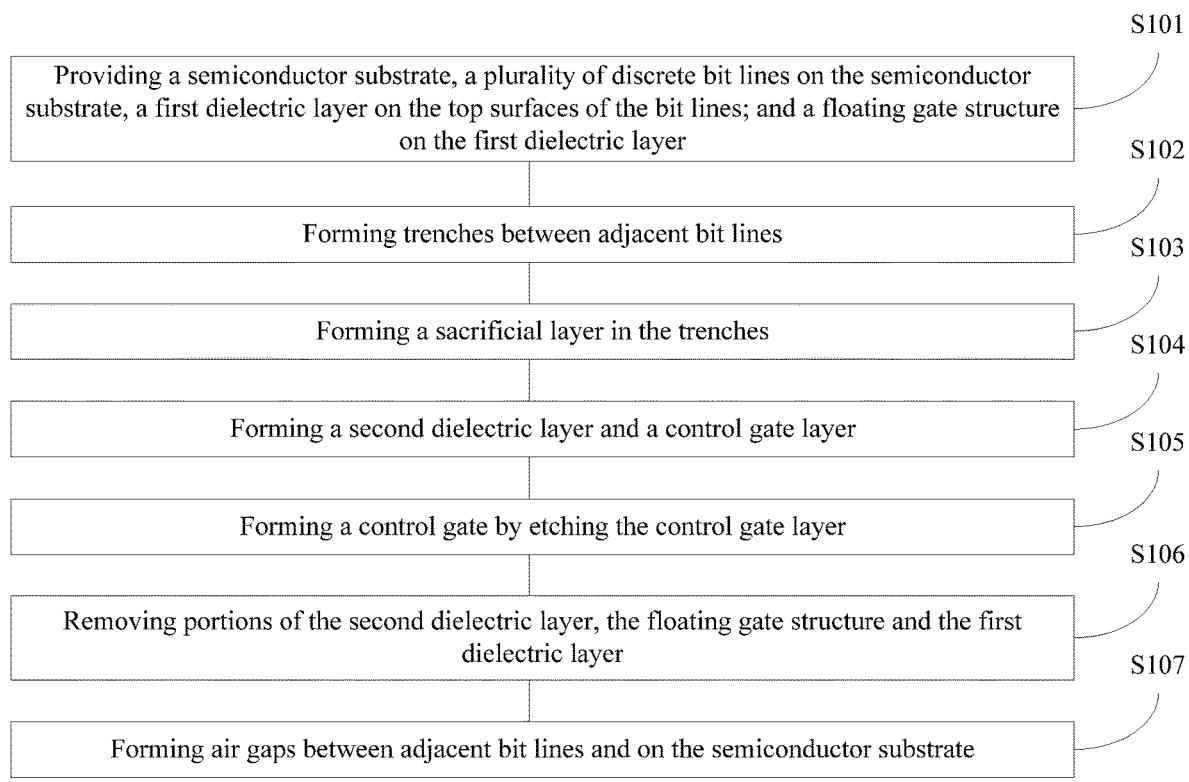
FIG. 10 illustrates an exemplary fabrication process of a flash memory device consistent with the disclosed embodiments.

FIG. 10 illustrates an exemplary fabrication process of a flash memory device consistent with various disclosed embodiments. FIGS. 1-9 illustrate structures corresponding to certain stages during the exemplary fabrication method consistent with various disclosed embodiments.

Figure 1:
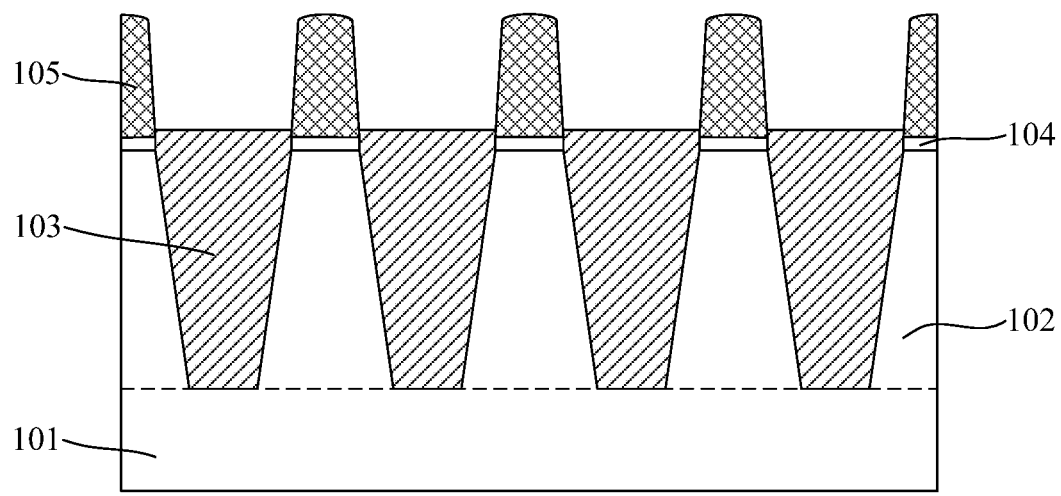
FIGS. 1-9 illustrate structures corresponding to certain stages during an exemplary fabrication process of a flash memory device consistent with various disclosed embodiments.
Figure 2:
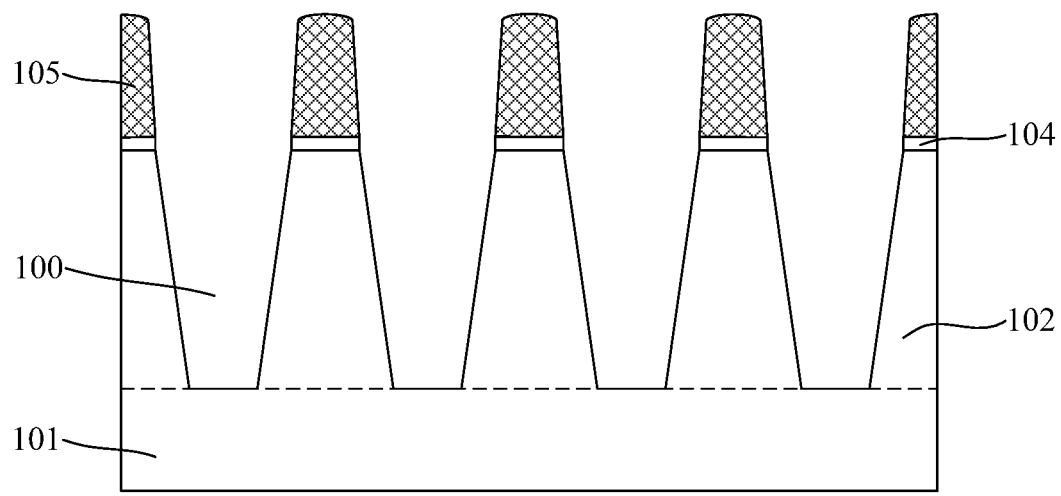
Figure 3:
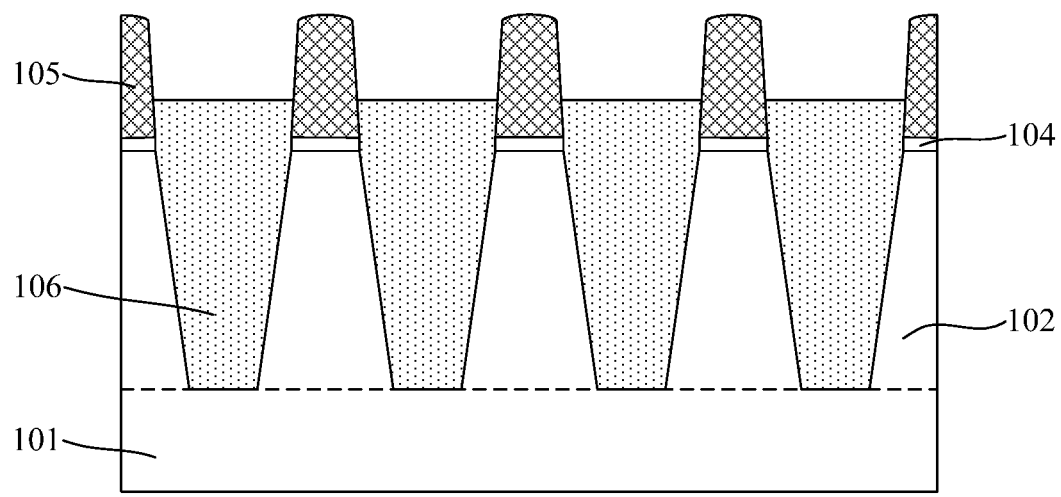

As shown in FIGS. 1-3, the fabrication process may include providing a semiconductor substrate 101, a plurality of discrete bit lines 102 on the semiconductor substrate 101, a first dielectric layer 104 on the top surfaces of the bit lines 102; and a floating gate structure 105 on the first dielectric layer 104. Trenches 100 are formed between adjacent bit lines 102 and on the semiconductor substrate 101. A sacrificial layer 106 may be filled in the trenches 100; and the top surface of the sacrificial layer 106 may be above the top surfaces of the bit lines 102.

The semiconductor substrate 101 and the bit lines 102 may be made of a same material. The semiconductor substrate 101 may be made of Si, Ge, GeSi, SiC, GaAs, or GaIn, etc. The semiconductor substrate 101 may also be a silicon on insulator (SOI) substrate, or a germanium on insulator (GOI) substrate. In some embodiments, the semiconductor substrate and the bit lines may be made of different materials.

In one embodiment, the semiconductor substrate 101 is made of Si. The bit lines 102 are made of Si.

In one embodiment, the bit lines 102 on the semiconductor substrate 101 are in parallel with each other.

The first dielectric layer 104 may be used to electrically isolate the bit lines 102 and the floating gate structure 105. The first dielectric layer 104 may be made of any appropriate material, such as silicon oxide, silicon nitride, or silicon oxynitride, etc. The floating gate structure 105 may be made of polysilicon, or doped polysilicon, etc.

During the subsequent processes for forming the second dielectric layer and the control gate layer, the sacrificial layer 106 may be used to support the second dielectric layer and the control gate layer. Further, after subsequently forming the control gate structure, the sacrificial layer 106 may be removed. Thus, air gaps may be formed between adjacent bit lines 102.

The sacrificial layer 106 may be made of a material that is easy to remove. Further, the subsequent process for removing the sacrificial layer 106 may not damage the second dielectric layer and the control gate structure.

In one embodiment, the sacrificial layer 106 is made of advanced patterning film (APF) material. In some embodiments, the sacrificial layer may be made of a bottom antireflective coating (BARC) material, etc.

The details for providing the semiconductor substrate 101, the bit lines 102, the first dielectric layer 104, the floating gate structure 105 and the sacrificial layer 106 are described as following.

As shown in FIG. 10, at the beginning of the fabrication process, a semiconductor substrate with certain structures is provided (S101). FIG. 1 illustrates a corresponding structure.

As shown in FIG. 1, the semiconductor substrate 101 is provided. A plurality of discrete bit lines 102 are formed on the semiconductor substrate 101. The first dielectric layer 104 is formed on the top surfaces of the bit lines 102; and a floating gate structure 105 is formed on the first dielectric layer 104. Further, isolation structures 103 may be formed on the semiconductor substrate 101 exposed by the bit lines 102; and the isolation structures 103 may cover the side surfaces of the bit lines 102.

In one embodiment, the isolation structures 103 are made of silicon oxide. In some embodiments, the isolation structures may be made of SiN, or SiON, etc.

The semiconductor substrate 101, the bit lines 102, the first dielectric layer 104, the floating gate structure 105 and the isolation structures 103 may be formed by a cell open (COPEN) step of the flash memory.

For example, the process for forming the semiconductor substrate 101, the bit lines 102, the first dielectric layer 104, the floating gate structure 105 and the isolation structures 103 may include providing a base substrate; forming a first dielectric film on the base substrate; forming a floating gate film on the first dielectric film; forming a patterned hard mask layer on the floating gate film; and etching the floating gate film, the first dielectric film and a partial thickness of the base substrate using the patterned hard mask layer as a mask. The etched floating gate film may be used as the first dielectric layer 104; the etched base substrate may be used as the semiconductor substrate 101 and the bit lines 102. Then, an isolation film may be formed on the portions of the semiconductor substrate 101 exposed by the bit lines 102. The isolation film may cover the side surfaces of the bit lines 102; and the top surface of the isolation film may be above the top surface of the floating gate structure 106. Then, an etch-back process may be performed to remove a portion of the isolation film to form the isolation structure 103; and the patterned mask layer may be removed.

The top surfaces of the isolation structures 103 may be above the top surfaces of the bit lines 102. In one embodiment, the top surfaces of the isolation structures 103 may be above the bottom surface of the floating gate structure 106. That is, the isolation structures 103 may cover portions of the side surfaces of the floating gate structure 105. In some embodiments, the top surfaces of the isolation structures may level with the bottom surface of the floating gate structure, or the top surface of the isolation structure may be below the bottom surface of the floating gate structure.

In one embodiment, the bottom width of the bit line 102 may be greater than the top width of the bit line 102. In some embodiments, the bottom width of the bit line may be substantially the same as the top width of the bit line.

Returning to FIG. 10, after forming the isolation structure, trenches may be formed (S102). FIG. 2 illustrates a corresponding structure.

As shown in FIG. 2, the isolation structure 130 (referring to FIG. 1) is removed; and a trench 100 is formed between adjacent bit lines 102 and on the semiconductor substrate 101. That is, the plurality of the isolation structures 130 may be removed; and a plurality of trenches 102 may be formed between adjacent bit lines 102 and on the semiconductor substrate 101.

The isolation structures 103 may be removed by any appropriate process. In one embodiment, a wet etching process is used to remove the isolation structures 103 to form the trenches 100.

In one embodiment, the isolation structures 103 are made of silicon oxide, the etching solution of the wet etching process may be a HF solution.

Returning to FIG. 10, after removing the isolation structures to form the trenches, a sacrificial layer may be formed (S103). FIG. 3 illustrates a corresponding structure.

As shown in FIG. 3, a sacrificial layer 106 is formed in the trenches 100. The sacrificial layer 106 may be filled into the trenches 100. The top surface of the sacrificial layer 106 may be above the top surfaces of the bit lines 102.

In one embodiment, the sacrificial layer 106 may be made of a material different from that of the isolation structures 103 (referring to FIG. 1).

Figure 3A:
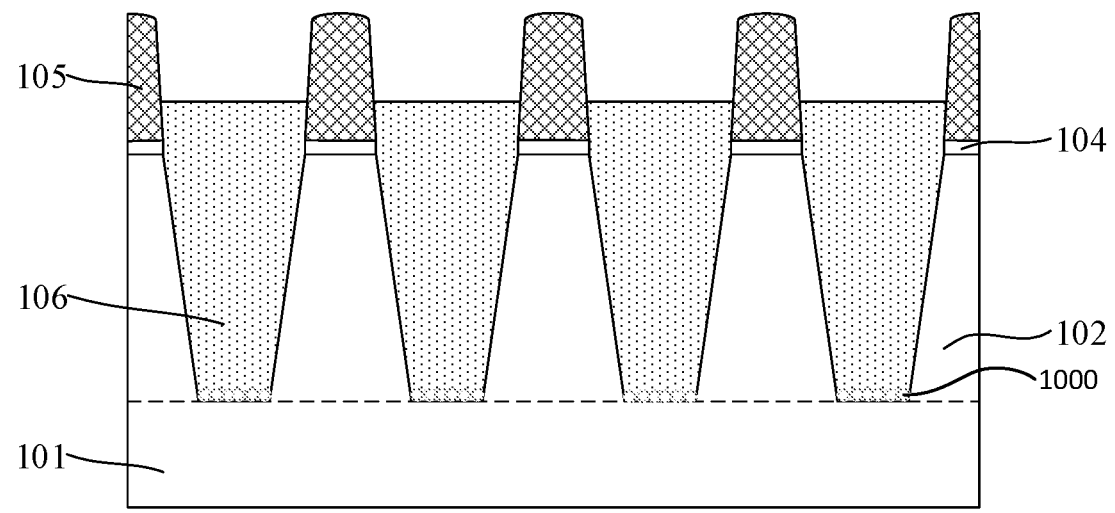

In one embodiment, during the process for forming the sacrificial layer 106, the sacrificial layer 106 may fill the trenches 100. In some embodiments, the bottom of the sacrificial layer and the semiconductor substrate may have a gap 1000 as shown in FIG. 3A. That is, the process for forming the sacrificial layer may not have a high-filling effect.

To prevent the subsequently formed control layer and the bit lines 102 from having an unnecessary electrical connection, the top surface of the sacrificial layer 106 may be above the top surfaces of the bit lines 102.

In one embodiment, the top surface of the sacrificial layer 106 is above the top surface of the floating gate structure 105. The sacrificial layer 106 may cover portions of the side surfaces of the floating gate structure 105. In some embodiments, the top surface of the sacrificial layer may level with the bottom surface of the floating gate structure, or the top surface of the sacrificial layer may be below the top surface of the floating gate structure.

The process for forming the sacrificial layer 106 may include forming a sacrificial film to fill the trenches 100, with a top surface above the top surface of the floating gate structure 105; planarizing the top surface of the sacrificial film; and etching-back a partial thickness of the planarized sacrificial film to form the sacrificial layer 106.

In one embodiment, the isolation structures 103 are removed after forming the isolation structures 103, then the sacrificial layer 106 may be formed. In some embodiments, the isolation structures may be used as a sacrificial layer. Specifically, the process for forming the sacrificial layer may include providing a semiconductor substrate, a plurality of discrete bit lines on the semiconductor substrate, a first dielectric layer on the top surfaces of the bit lines, and isolation structures on the semiconductor substrate exposed by the bit lines. The isolation structures may be used as a sacrificial layer; and the top surfaces of the isolation structures may be above the top surfaces of the bit lines. The isolation structures may be made of silicon oxide, or silicon nitride, etc.

Figure 4:
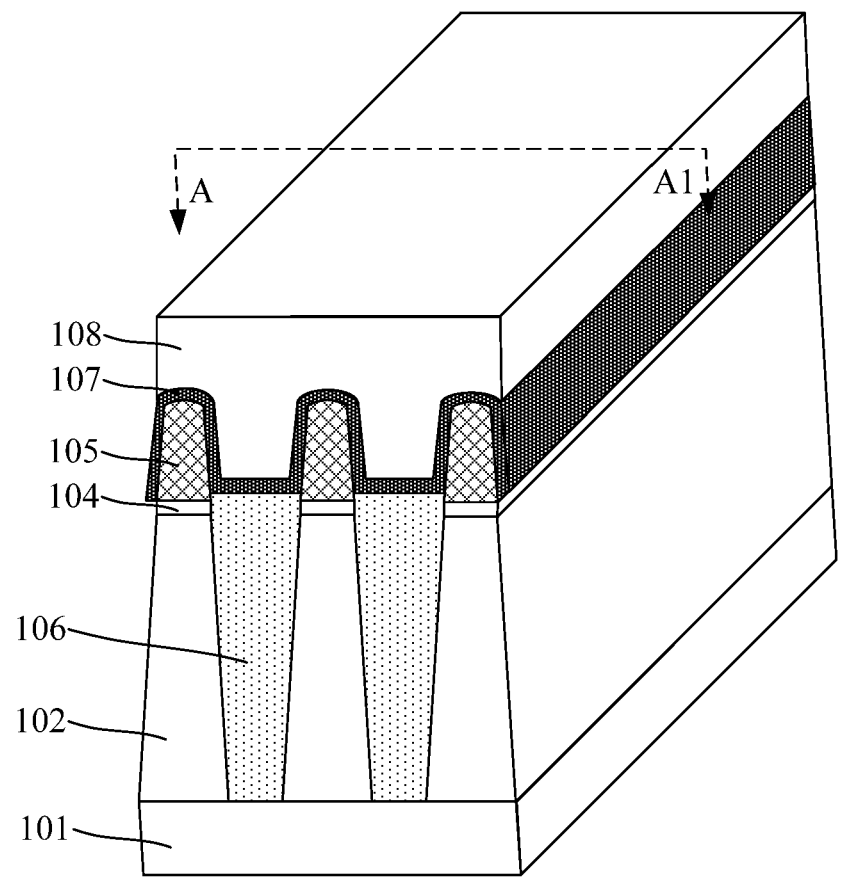
Figure 5:
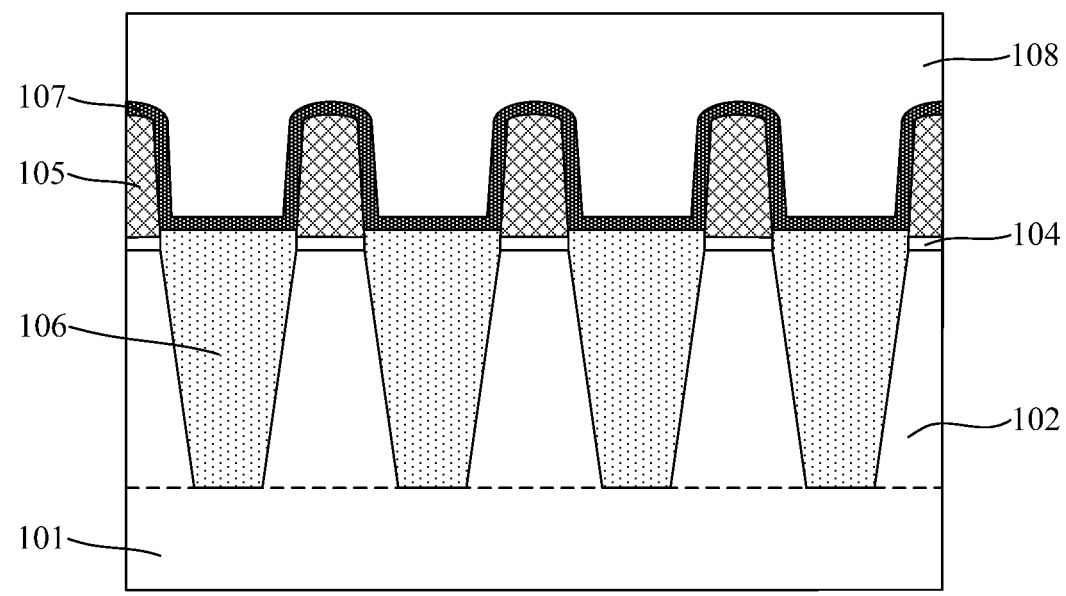

Returning to FIG. 10, after forming the sacrificial layer, a second dielectric layer and a control gate layer may be formed (S104). FIGS. 4-5 illustrate a corresponding structure. FIG. 4 illustrates a three-dimensional view of a portion of the structure; and FIG. 5 is a cross-sectional view of the structure illustrated in FIG. 4 along the AA1 direction.

As shown in FIGS. 4-5, a second dielectric layer 107 is formed on the top and side surfaces of the floating gate structure 105 and the top surface of the sacrificial layer 106. A control gate layer 108 may be formed on the second dielectric layer 107.

For illustrative purposes, three discrete bit lines 102 are illustrated in FIG. 4, although any number of bit lines may be included in the present disclosure. FIG. 4 is a three dimensional view of a portion of the structure illustrated in FIG. 5.

The second dielectric layer 107 may be used as a gate dielectric layer. The second dielectric layer 107 may be used to electrically isolate the subsequently formed control gate structure from the floating gate structure.

In one embodiment, the second dielectric layer 107 may be a multi-layer stacked structure, having the structure of silicon oxide-silicon nitride-silicon oxide (oxide-nitride-oxide, ONO).

In some embodiments, the second dielectric layer may be a single-layer structure. The second dielectric layer may be made of one of silicon oxide and silicon nitride, etc.

In one embodiment, the thickness of the second dielectric layer 107 may be in a range of approximately 10 Å-50 Å. Various processes may be used to form the second dielectric layer 107, such as a chemical vapor deposition (CVD) process, a physical vapor deposition (PVD) process, or an atomic layer deposition (ALD) process, etc. In one embodiment, the second dielectric layer 107 is formed by an ALD process.

The control gate layer 108 may provide a process base for subsequently forming a control gate structure. The control gate layer 108 may be made of any appropriate material, such as polysilicon, or doped polysilicon, etc. Various processes may be used to form the control gate layer 108, such as a CVD process, a PVD process, or an ALD process, etc.

Figure 6:
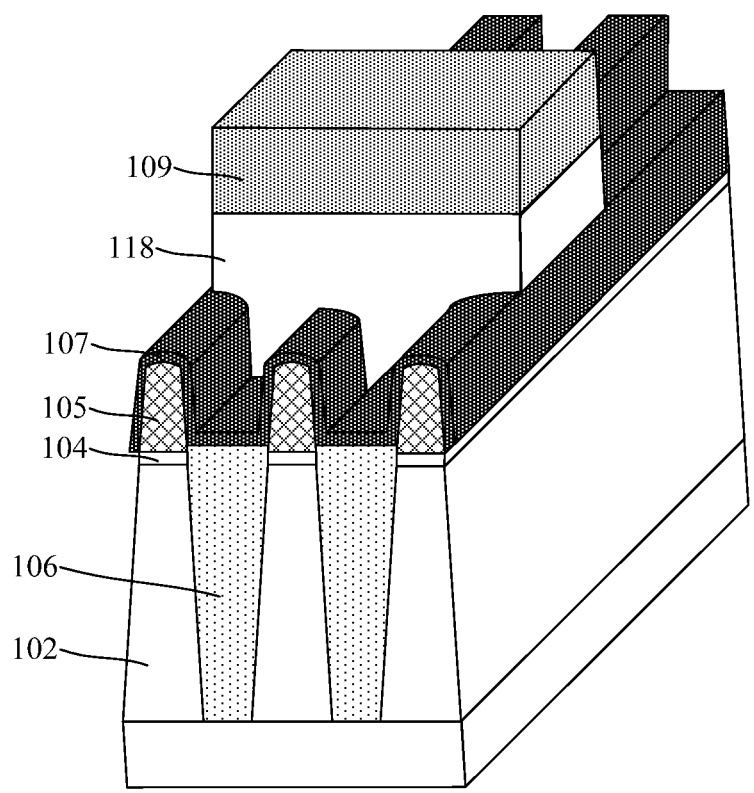

Returning to FIG. 10, after forming the control gate layer, a control gate structure may be formed (S105). FIG. 6 illustrates a corresponding semiconductor structure.

As shown in FIG. 6, a control gate structure 118 is formed. The control gate structure 108 may be formed by patterning the control gate layer 108 (referring to FIGS. 4-5). The control gate structure 118 may expose a portion of the second dielectric layer 107.

The control gate structure 118 may be across the floating gate structure 105 on at least two bit lines 102. In one embodiment, the control gate structure 118 is across the floating gate structure 105 on five bit lines 102.

In one embodiment, the process for forming the control gate structure 118 may include forming a mask layer 109 defining the size and position of the control gate structure 118 on the control gate layer 108; and etching the control gate layer 108 using the mask layer 109 until a portion of the surface of the second dielectric layer 107 is exposed. Thus, the control gate structure 118 may be formed.

In one embodiment, after forming the control gate structure 118, the mask layer 109 on the control gate structure 118 may be retained. The retained mask layer 119 may be used as a mask layer during the subsequent process for etching the floating gate structure 105.

In some embodiments, the mask layer may be removed after forming the control gate structure. Accordingly, before subsequently etching the floating gate structure, a pattern layer may be formed on the top surface of the control gate structure.

Figure 7:
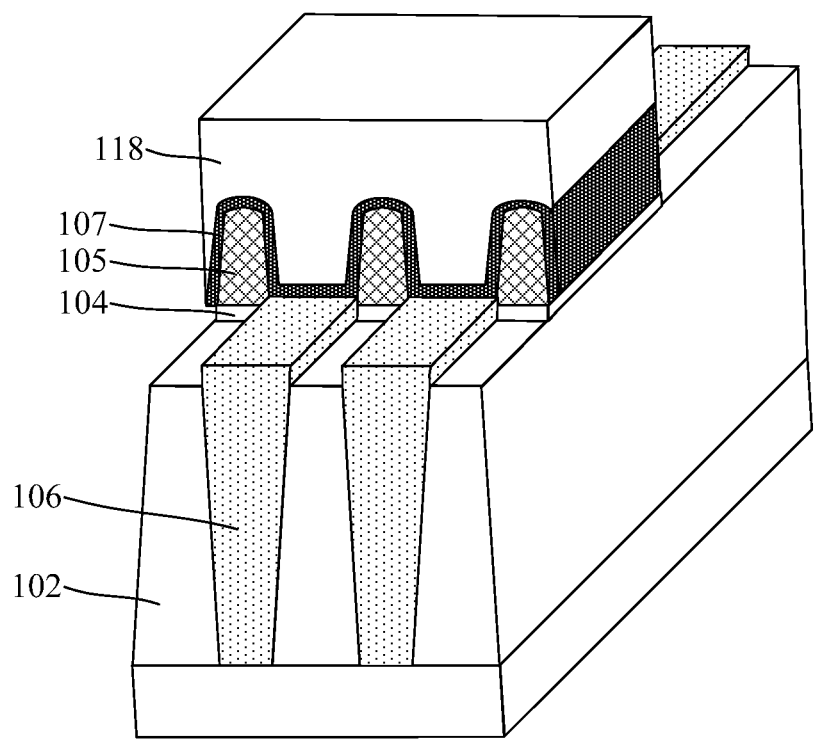

Returning to FIG. 10, after forming the control gate structure, portions of the second dielectric layer, the floating gate structure and the first dielectric layer may be removed (S106). FIG. 7 illustrates a corresponding structure.

As shown in FIG. 7, the portions of the second dielectric layer 107, the floating gate structure 105 and the first dielectric layer 104 exposed by the control gate structure 118 may be removed; and a portion of the top surface of the sacrificial layer 106 may be exposed.

In one embodiment, the portions of the second dielectric layer 107, the floating gate structure 105 and the first dielectric layer 104 may be etched using the mask layer 109 (referring to FIG. 6) as an etching mask until the top surfaces of the bit lines 102 and the top surface of the sacrificial layer 106 are exposed. After exposing a portion of the top surface of the sacrificial layer 106, the mask layer 109 may be removed.

The portions of the second dielectric layer 107, the floating gate structure 105 and the first dielectric layer 104 may be etched by any appropriate processes, such as a dry etching process, a wet etching process, or an ion beam etching process, etc. In one embodiment, a dry etching process is used to etch the portions of the second dielectric layer 107, the floating gate structure 105 and the first dielectric layer 104.

Returning to FIG. 10, after removing the portions of the second dielectric layer, the floating gate structure and the first dielectric layer, air gaps may be formed (S107). FIGS. 8-9 illustrate a corresponding semiconductor structure. FIG.

8 illustrates a three dimensional view of a portion of the structure illustrated in FIG. 9; and FIG. 9 is a cross-sectional view of the structure illustrated in FIG. 8 along the AA1 direction.

As shown in FIGS. 8-9, after exposing a portion of the sacrificial layer 106 by removing the portions of the second dielectric layer 107, the floating gate structure 105 and the first dielectric layer 104, the sacrificial layer 106 may be removed; and air gaps 110 may be formed or enclosed by adjacent bit lines 102 and the semiconductor substrate 101. That is, one air gap 110 may be enclosed by two adjacent bit lines 102 and the semiconductor substrate 101.

Various processes may be used to remove the sacrificial layer 106. In one embodiment, the process for removing the sacrificial layer 106 may include introducing oxygen to the sacrificial layer 106 to remove the sacrificial layer 106.

The sacrificial layer 106 may be made of an APF material or a BARC material. Under the function of an oxygen-containing gas, the oxygen containing gas may react with the material of the sacrificial layer 106 to form a gas including $CO_2$, and the sacrificial layer 106 may be removed.

Under the function of the oxygen-containing gas, the adverse effect to the first dielectric layer 104, the floating gate structure 105, the second dielectric layer 107 and the control gate structure may be substantially small. During the process for removing the sacrificial layer 106, the adverse effect to the flash memory device may be reduced, or substantially eliminated.

The oxygen-containing gas may be $O_2$, or $O_3$, etc. During the process for removing the sacrificial layer 106, the process temperature should not be too low. If the process temperature is too low, the reaction rate between the oxygen-containing gas and the sacrificial layer 106 may be too low. Thus, the efficiency for removing the sacrificial layer 106 may be relatively low. If the process temperature is too high, the oxygen-containing gas may unnecessarily oxidize the floating gate structure and/or the control gate structure 118.

Thus, in one embodiment, the oxygen-containing gas is $O_2$, or $O_3$. The process temperature may be in a range of approximately 90° C.-110° C.

Because the sacrificial layer 106 between adjacent bit lines 102 may be removed, air gaps 110 may be formed between adjacent bit lines 102. Air may have a relatively low dielectric constant. Thus, the electrical interference between adjacent bit lines 102 may be reduced, or substantially avoided. Accordingly, the distance between adjacent bit lines 102 may be further reduced; and the miniaturization trend of the flash memory device may be matched.

In some embodiments, when isolation structures are used as the sacrificial layer, the isolation structures may be made of silicon oxide or silicon nitride. Correspondingly, a wet etching process may be used to remove the sacrificial layer. Specifically, when the isolation structures are made of silicon oxide, the sacrificial layer may be removed by a phosphoric acid.

Correspondingly, a flash memory device may be formed by the disclosed methods and processes. FIGS. 8-9 illustrate a corresponding flash memory device.

As shown in FIGS. 8-9, the flash memory device may include a semiconductor substrate 101; a plurality of discrete bit lines 102 on the semiconductor substrate 101; a first dielectric layer 104 on the top surfaces of the bit lines 102; and a floating gate structure 105 on the first dielectric layer 104. An air gaps 110 may be formed between adjacent bit lines 102 and on the semiconductor substrate 101.

The flash memory device may also include a second dielectric layer 107 on the top surface and the side surfaces of the floating gate structure 105; and a control gate structure 118 on the second dielectric layer 107.

For illustrative purposes, three bit lines 102 are illustrated in FIG. 8, although any number of bit lines may be included in the present disclosure. FIG. 8 is a three-dimensional view of a portion of the structure illustrated in FIG. 9.

The semiconductor substrate 101 and the bit lines 102 may be made of a same material. The semiconductor substrate 101 may be made of Si, Ge, SiGe, SiC, GaAs, or GaIn, etc. The semiconductor substrate 101 may also be an SOI substrate, or a GOI substrate.

In one embodiment, the semiconductor substrate 101 is made of Si; and the bit lines 102 are made of Si.

In one embodiment, along the distribution direction of the bit lines 102, the bottom width of the bit line 102 is greater than the top width of the bit line 102. In some embodiments, along the distribution direction of the bit lines, the bottom width of the bit line may be substantially the same as the top width of the bit line.

The first dielectric layer 104 may be made of silicon oxide, silicon nitride, or silicon oxynitride, etc. The floating gate structure 105 may be made of polysilicon, or doped polysilicon, etc.

The second dielectric layer 107 may cover the top surface and the side surfaces of the floating gate structure 105. In one embodiment, the second dielectric layer 107 may have a structure of silicon oxide-silicon nitride-silicon oxide. In some embodiments, the second dielectric layer may be made of one of silicon oxide, and silicon nitride, etc.

The second dielectric layer 107 may be across the floating gate structure 105 on at least two bit lines 102; and the second dielectric layer 107 may be across the air gaps 110 between adjacent bit lines 102. Specifically, the second dielectric layer 107 may cover the side and top surfaces of the floating gate structure 105 on the at least two bit lines 102; and may be across the air gaps 110 between adjacent bit lines 102.

The control gate structure 118 may be across the floating gate structure 105 on at least two bit lines 102; and the control gate structure 118 may be across the air gaps 110 between the adjacent bit lines 102.

In one embodiment, the control gate structure 118 is across the floating gate structure 105 on five bit lines 102. In some embodiments, the control gate structure may be across the floating gate structure on other appropriate number of, less or more than five, bit lines.

Because the air gaps 110 may be formed between the adjacent bit lines 102 and the semiconductor substrate 101; and the air gaps 110 may have a relatively low dielectric constant, the electrical interferences between adjacent bit lines 102 may be reduced, or substantially avoided. Thus, the electrical properties of the flash memory device may be improved.

Thus, the disclosed fabrication methods and flash memory devices may have following advantages.

In the disclosed fabrication methods, a semiconductor substrate, a plurality of bit line, a first dielectric layer, and a floating gate structure may be provided. Trenches may be formed between the adjacent bit lines and the semiconductor substrate. A sacrificial layer may be filled in the trenches; and the top surface of the sacrificial layer may be above the top surfaces of the bit lines. Thus, the electrical connection between the subsequently formed control gate layer and the bit lines may be prevented.

Further, a second dielectric layer may be formed on the top and side surfaces of the floating gate structure and the top surface of the sacrificial layer. Then, a control gate layer may be formed on the second dielectric layer; the control gate layer may be patterned to form a control gate structure; the portions of the second dielectric layer, the floating gate structure, the first dielectric layer exposed by the control gate structure may be removed to expose a portion of the top surface of the sacrificial layer; and the sacrificial layer may be removed. The adjacent bit lines and the semiconductor substrate may form air gaps. Because the air gaps may have a relatively low dielectric constant, the relative dielectric constant between adjacent bit lines may be relatively low. Thus, the electrical interferences between the adjacent bit lines may be reduced, or substantially avoided; and the electrical properties of the flash memory device may be improved.

The process for forming the sacrificial layer may include removing the isolation structures after forming the isolation structures between the adjacent bit lines to form the trenches between the adjacent bit lines and the semiconductor substrate; and forming the sacrificial layer in the trenches. The sacrificial layer may be made of a material different from the isolation structures. In a commonly used process for forming the flash memory device, the isolation structures and the first dielectric layer and/or the second dielectric layer may be made a same material. In the disclosed embodiments, a material different from the material of the first dielectric layer and the second dielectric layer may be used as the sacrificial material, the damage to the first dielectric layer and the second dielectric layer caused by the process for removing the sacrificial layer may be substantially avoided.

In the disclosed flash memory devices, because air gaps may be formed between adjacent bit lines and on the semiconductor substrate, the relative dielectric constant between the bit lines and the semiconductor substrate may be relatively low. Thus, the electrical interferences between the adjacent bit lines may be reduced, or substantially avoided. Accordingly, the electrical properties of the flash memory device may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a flash memory device, comprising:
   providing a plurality of discrete bit lines on a semiconductor substrate, a first dielectric layer on a top surface of the bit lines, and a floating gate structure on the first dielectric layer, wherein trenches are formed between adjacent bit lines and on the semiconductor substrate;
   forming a sacrificial layer with a top surface above the top surface of the bit lines in the trenches, a gap being formed between a bottom of the sacrificial layer and a top surface of the semiconductor substrate;
   forming a second dielectric layer on a top surface and side surfaces of the floating gate structure and the top surface of the sacrificial layer;
   forming a control gate structure on the second dielectric layer;
   removing portions of the second dielectric layer, the floating gate structure and the first dielectric layer exposed by the control gate structure to expose a portion of the top surface of the sacrificial layer; and
   removing the sacrificial layer from the adjacent bit lines and the semiconductor substrate, thereby forming air gaps to expose the semiconductor substrate between the adjacent bit lines, wherein each of the air gaps is enclosed by the adjacent bit lines, the semiconductor substrate, and the second dielectric layer.

2. The method according to claim 1, wherein filling the sacrificial layer in the trenches comprises:
   providing the semiconductor substrate, the bit lines on the semiconductor substrate, the first dielectric layer on the top surface of the bit lines and the floating gate structure on the first dielectric layer;
   providing an isolation structure on the base substrate exposed by the bit lines;
   removing the isolation structure to form the trenches; and
   filling the sacrificial layer in the trenches.

3. The method according to claim 2, wherein:
   the sacrificial layer is made of one of an advanced patterning film (APF) material and a bottom antireflective coating (BARC) material.

4. The method according to claim 3, wherein removing the sacrificial layer comprises:
   introducing an oxygen-containing gas to the sacrificial layer to remove the sacrificial layer.

5. The method according to claim 4, wherein:
   the oxygen-containing gas is one of $O_2$ and $O_3$; and
   a process temperature for removing the sacrificial layer is in a range of approximately 90° C.-110° C.

6. The method according to claim 2, wherein:
   the isolation structure is made of one of silicon oxide, silicon nitride and silicon oxynitride.

7. The method according to claim 2, wherein:
   the sacrificial layer fills at least top portions of the trenches.

8. The method according to claim 2, wherein:
   the top surface of the sacrificial layer is above a bottom surface of the floating gate structure.

9. The method according to claim 1, wherein forming the control gate structure comprises:
   forming a control gate layer on the second dielectric layer;
   forming a mask layer on the control gate layer; and
   etching the control gate layer using the mask layer as an etching mask to expose the second dielectric layer.

10. The method according to claim 9, wherein removing the portions of the second dielectric layer, the floating gate structure and the first dielectric layer comprises:
    etching to remove the portions of the second dielectric layer, the floating gate structure and the first dielectric layer using the mask layer as an etching mask; and
    removing the mask layer.

11. The method according to claim 1, wherein forming the sacrificial layer comprises:
    providing the bit lines on the semiconductor substrate, the first dielectric layer on the top surface of the bit lines and the floating gate structure on the first dielectric layer; and
    forming insolation structures covering side surfaces of the bit lines on the semiconductor substrate exposed by the bit lines, wherein the isolation structures are used as the sacrificial layer.

12. The method according to claim 11, wherein:
    the isolation structure is made of one of silicon oxide and the silicon nitride.

13. The method according to claim 11, wherein:
    the sacrificial layer is removed by a wet etching process.

14. The method according to claim 13, wherein:
a hydrogen fluoride solution is used to remove the sacrificial layer, when the isolation structure is made of silicon oxide.

15. The method according to claim 11, wherein, providing the plurality of bit lines on the semiconductor substrate, the first interlayer dielectric layer, and forming the isolation structure comprises:
providing a base substrate;
forming a first interlayer dielectric film on the base substrate and a control gate layer on the first interlayer film;
forming a patterned hard mask layer on the floating gate layer;
etching the floating gate layer, the first dielectric film and a partial thickness of the base substrate using the patterned mask layer as an etching mask, wherein the etched floating gate layer is used as the floating gate structure, the etched first dielectric film is used as the first dielectric layer, and the etched based substrate is used as the semiconductor substrate and the bit lines;
forming an isolation film with a top surface above the top surfaces of the bit lines and covering side surfaces of the bit lines on portions of the semiconductor substrate exposed by the bit lines; and
removing a partial thickness of the isolation film to form the isolation structure.

16. The method according to claim 1, wherein:
the control gate structure is across a gate structure on at least two bit lines.

17. The method according to claim 1, wherein:
the sacrificial layer is completely removed to expose side surfaces of each of the plurality of discrete bit lines, a top surface of the substrate, and a bottom surface of the second dielectric layer.

18. The method according to claim 2, wherein:
a top surface of the isolation structure is above the top surface of each of the plurality of discrete bit lines.

19. The method according to claim 1, wherein:
a bottom width of plurality of discrete bit lines is greater than a top width of the plurality of discrete bit lines, and
a width of plurality of discrete bit lines gradually increases from a top of the plurality of discrete bit lines to a bottom of the of the plurality of discrete bit lines.

* * * * *